(12) United States Patent
Mauer

(10) Patent No.: US 9,748,928 B1
(45) Date of Patent: Aug. 29, 2017

(54) DYNAMICALLY PROGRAMMABLE DIGITAL SIGNAL PROCESSING BLOCKS FOR FINITE-IMPULSE-RESPONSE FILTERS

(71) Applicant: Altera Corporation, San Jose, CA (US)

(72) Inventor: Volker Mauer, Princes Risborough (GB)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 15/256,223

(22) Filed: Sep. 2, 2016

Related U.S. Application Data

(63) Continuation of application No. 14/152,955, filed on Jan. 10, 2014, now Pat. No. 9,438,203.

(51) Int. Cl.
*H03H 17/02* (2006.01)
*G06F 17/50* (2006.01)

(52) U.S. Cl.
CPC ..... *H03H 17/0248* (2013.01); *G06F 17/5054* (2013.01)

(58) Field of Classification Search
CPC ........ G06F 7/5324; G06F 7/5443; G06F 7/57; G06F 7/575; G06F 15/7867; G06F 17/505; G06F 17/5054
See application file for complete search history.

(56) References Cited

U.S. PATENT DOCUMENTS

| 7,287,051 | B1* | 10/2007 | Langhammer | G06F 7/5324 |
| | | | | 708/490 |
| 8,041,759 | B1* | 10/2011 | Langhammer | H03K 19/177 |
| | | | | 326/38 |
| 8,090,758 | B1* | 1/2012 | Shimanek | G06F 7/5443 |
| | | | | 708/501 |
| 9,081,634 | B1* | 7/2015 | Simkins | G06F 7/57 |
| 2005/0144212 | A1* | 6/2005 | Simkins | G06F 15/7867 |
| | | | | 708/490 |
| 2006/0230094 | A1* | 10/2006 | Simkins | G06F 7/02 |
| | | | | 708/625 |
| 2010/0191786 | A1* | 7/2010 | Simkins | H03K 19/17732 |
| | | | | 708/209 |
| 2010/0228807 | A1* | 9/2010 | Langhammer | H03K 19/17732 |
| | | | | 708/209 |

* cited by examiner

*Primary Examiner* — Matthew Sandifer
(74) *Attorney, Agent, or Firm* — Fletcher Yoder, P.C.

(57) ABSTRACT

Digital signal processing ("DSP") block circuitry on an integrated circuit ("IC") is adapted for use, e.g., in multiple instances of the DSP block circuitry on the IC, for implementing finite-impulse-response ("FIR") filters that are dynamically adjustable. Advantages of such DSP block circuitries may include an increase in performance and a reduction in logic and memory usage for multi-standard FIR filters.

20 Claims, 6 Drawing Sheets

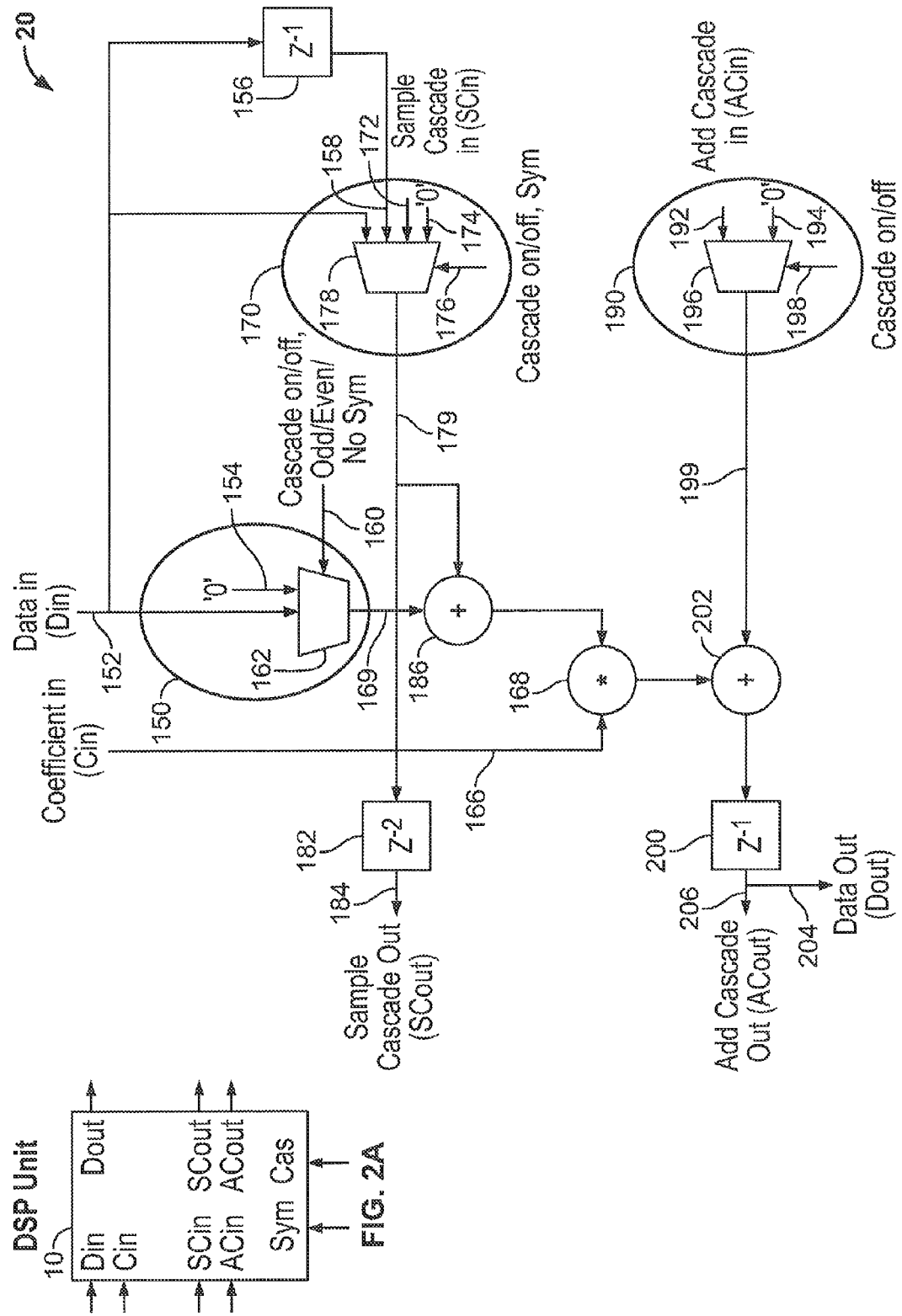

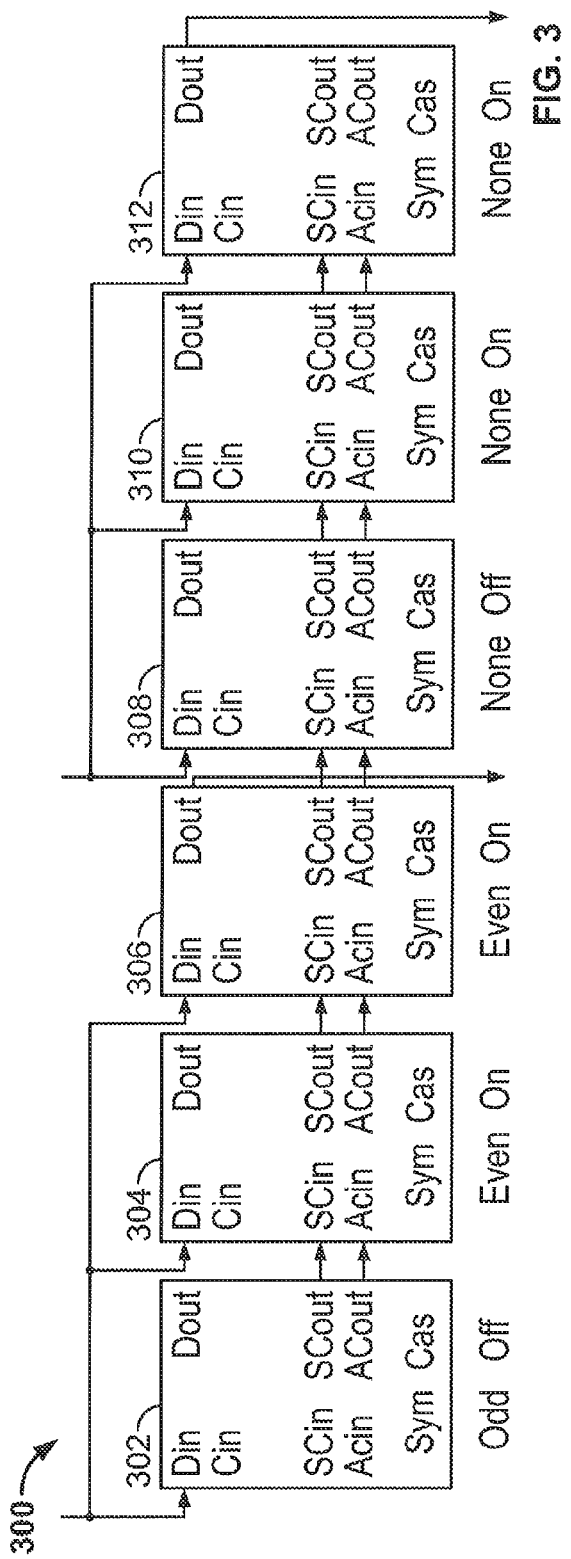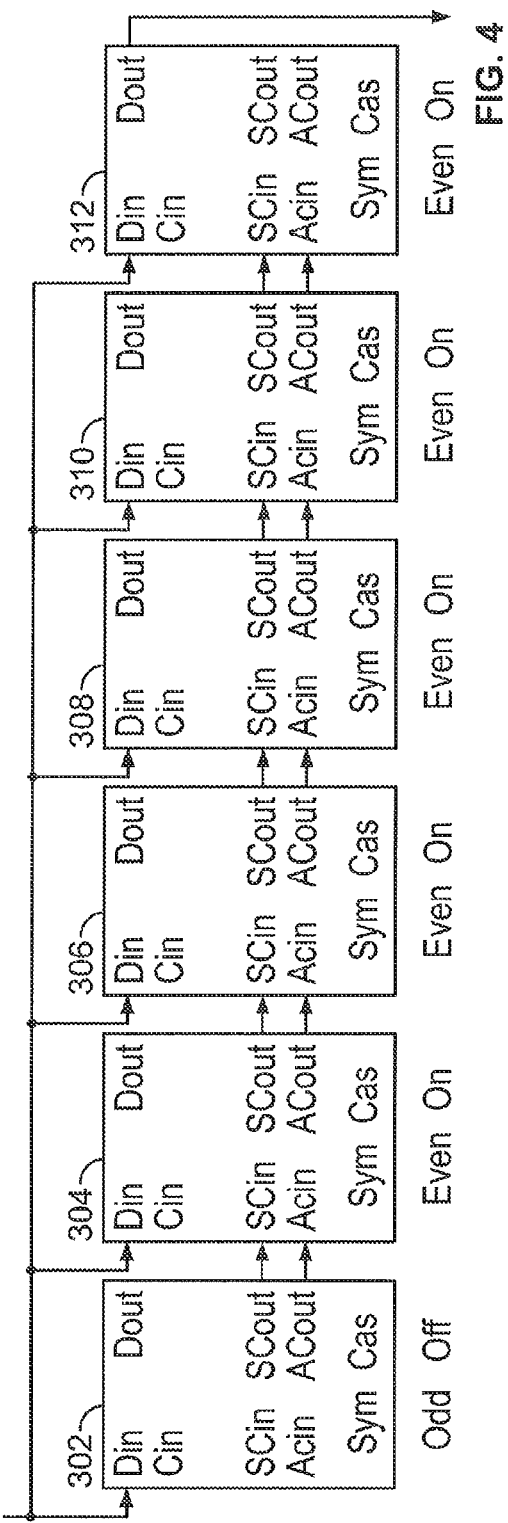

DYNAMICALLY PROGRAMMABLE DIGITAL SIGNAL PROCESSING BLOCKS FOR FINITE-IMPULSE-RESPONSE FILTERS

CROSS-REFERENCE TO RELATED APPLICATIONS

The present patent application is a continuation of U.S. application Ser. No. 14/152,955, filed on Jan. 10, 2014, entitled "Dynamically Programmable Digital Signal Processing Blocks For Finite-Impulse-Response Filters", by Volker Mauer, which is incorporated herein by reference in its entirety for all purposes.

FIELD

This disclosure relates to digital signal processing ("DSP") circuitry, especially on integrated circuit ("IC") devices. More particularly, the disclosure relates to such DSP circuitry that is adapted to perform finite-impulse-response ("FIR") digital filtering.

BACKGROUND

DSP circuitry may be provided on an integrated circuit ("IC") in the form of multiple instances (identical or substantially identical repetitions) of a "block" of DSP circuitry. Such a "DSP circuit block" (or "DSP block") may be capable of several different DSP operations, and the block may be controllable to select which of the possible DSP operations the block performs in any particular application of the IC. For example, the IC may be a programmable logic device ("PLD"), a field-programmable gate array ("FPGA"), or other similar type of device that is manufactured as a relatively general-purpose product that a user can "customize" to perform the functions needed by that user's particular application of the device. Such customization may be by programming function control data into so-called configuration memory cells (configuration random access memory or "CRAM") on the device. After having been thus programmed or configured, the IC can enter its normal or user mode of operation, in which it performs the functions (e.g., the DSP functions) it has been programmed or configured to perform. Manufacturing such an IC with DSP blocks that can satisfy any of a wide range of possible user needs increases the number of users who can use the IC for their particular applications. This increases the size of the market for the IC, which can benefit the manufacturer, but increased sales volume can also help to lower the unit cost of the IC, which can benefit users of the IC.

One advantageous form of relatively general-purpose DSP block circuitry includes the ability to feed its outputs (i.e., results of DSP operations it has performed) directly or substantially directly into another instance of the same DSP block circuitry on the IC for further processing in that other DSP block (so-called output chaining or cascading). Examples of such advantageous DSP block circuitry are shown in commonly assigned, U.S. patent application Ser. No. 12/380,841, filed Mar. 3, 2009, which is hereby incorporated by reference herein in its entirety.

Among the possible applications of DSP block circuitry of the type mentioned above is in the performance of finite-impulse-response ("FIR") digital filtering. FIR filtering typically involves passing successive input signal samples through a series of delay circuits, each of which delays each sample applied to it by the time duration of any one sample in the input sample stream. The just-mentioned "time duration" is typically the "period" or time duration of an "operating cycle" of the circuitry, or the period of a clock signal that is used to control the rate of such operating cycles. Each input sample and each sample output by each delay circuit in a given operating cycle of the circuitry is multiplied by a respective filter coefficient value, and all of the resulting multiplication products are added together to produce the output of the FIR filter for that operating cycle.

One possible limitation associated with current FIR filter implementations is that they are typically associated with configurations that are fixed at runtime, and as a result, they are difficult to use in applications that involve dynamic reconfiguration of filter functions or runtime adjustment of filter specifications. With the rising emphasis on rapid and flexible circuit operation and on multi-standard solutions, dynamic filter reconfiguration is an emerging and increasingly important functionality of integrated circuits.

SUMMARY

In accordance with certain possible aspects of the disclosure, digital signal processing ("DSP") block circuitry on an integrated circuit ("IC") is adapted for use (e.g., in multiple identical or substantially identical instances of the DSP block circuitry on the IC) for implementing finite-impulse-response ("FIR") filters that are dynamically adjustable to implement different filtering functions at runtime. The IC can be a Programmable Logic Device (PLD), Field Programmable Gate Array (FPGA), Application Specific Integrated Circuit (ASIC), Application Specific Standard Product (ASSP) or any suitable device.

In some embodiments, digital signal processing ("DSP") block circuitry is provided. The DSP block circuitry includes first switch circuitry for providing, as a first output, one of a data input and a null value; second switch circuitry for providing, as a second output, one of the data input, a sample cascade input, and the null value; third switch circuitry for selectively providing, as a third output, an add cascade input received from a first other instance of said DSP block circuitry; and combination circuitry for combining the first, second, and third outputs from the first, second, and third switch circuitries, respectively, to produce a filtered data output.

In some embodiments, a method of configuring a programmable integrated circuit as digital signal processing ("DSP") block circuitry is provided. Logic of said programmable integrated circuit is configured as first switch circuitry for providing, as a first output, one of a data input and a null value. Logic of said programmable integrated circuit is configured as second switch circuitry for providing, as a second output, one of the data input, a sample cascade input, and the null value. Logic of said programmable integrated circuit is configured as third switch circuitry for selectively providing, as a third output, an add cascade input received from a first other instance of said DSP block circuitry. Logic of said programmable integrated circuit is configured as combination circuitry for combining the first, second, and third outputs from the first, second, and third switch circuitries, respectively, to produce a filtered data output.

In some embodiments, a method of processing a signal using digital signal processing ("DSP") block circuitry is provided. The method includes providing using first switch circuitry, as a first output, one of a data input and a null value; providing using second switch circuitry, as a second output, one of the data input, a sample cascade input, and the null value; providing using third switch circuitry, as a third output, an add cascade input received from a first other instance of said DSP block circuitry; and combining the first, second, and third outputs from the first, second, and third switch circuitries, respectively, to produce a filtered data output.

Further features of the disclosure, its nature and various advantages will be more apparent from the accompanying drawings and the following detailed description.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which:

FIG. 2A is a simplified schematic block diagram of an illustrative DSP unit, according to some embodiments;

FIG. 2B shows one implementation of the DSP unit of FIG. 2A, in accordance with some embodiments;

FIG. 3 illustrates one possible configuration to implement a five-tap symmetrical filter and a three-tap non-symmetrical filter, in accordance with some embodiments;

FIG. 4 illustrates one possible configuration to implement an 1-tap symmetrical filter, in accordance with some embodiments;

DETAILED DESCRIPTION

Figure 1:
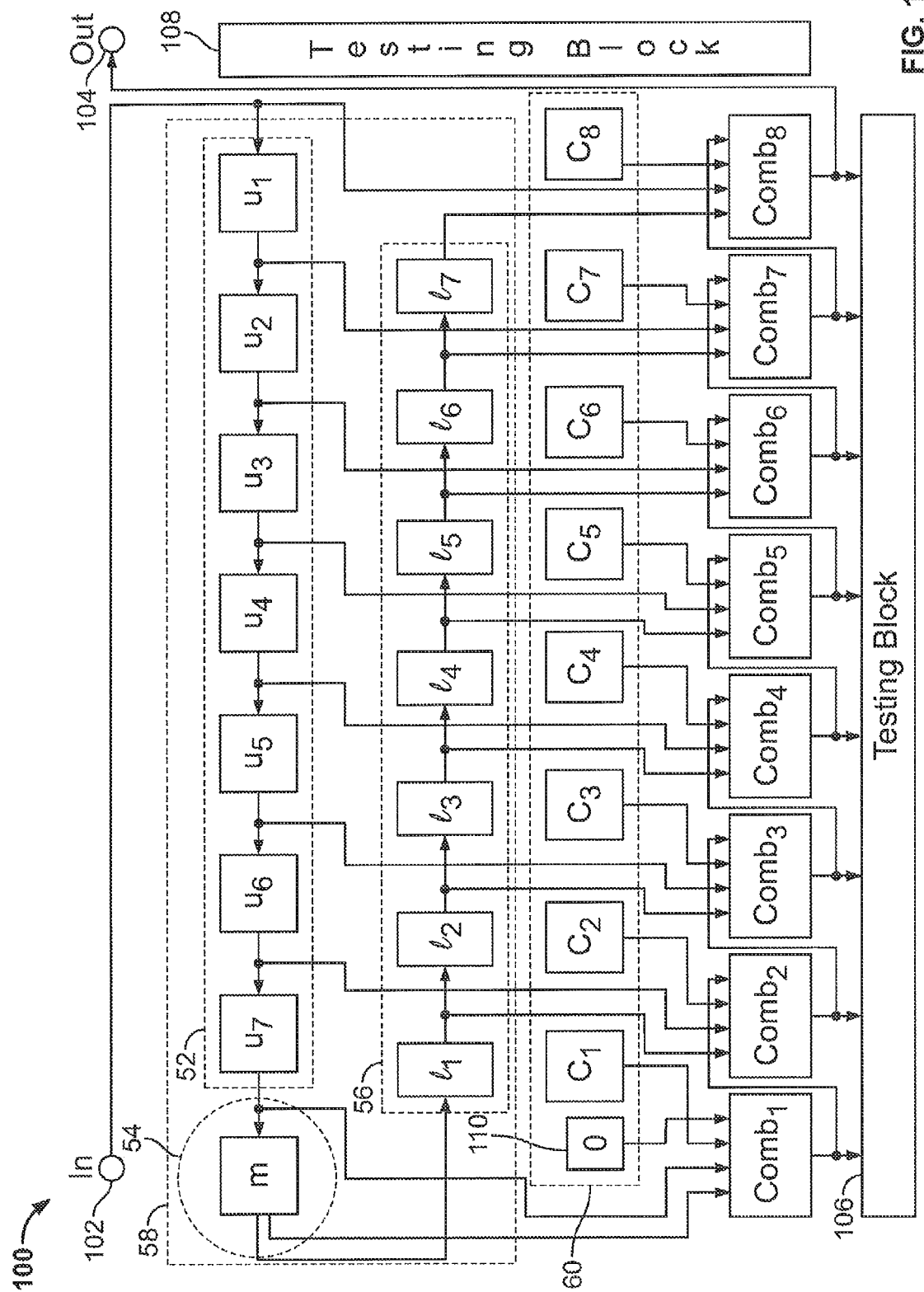
FIG. 1 is a simplified schematic block diagram of an illustrative N-tap filtering architecture, according to some embodiments.

Methods and systems described herein provide DSP circuitry on an integrated circuit in the form of multiple repetitions (or instances) of a particular form of module (or block or unit) of such circuitry. In some embodiments, any number of such modules can be cascaded together, at runtime, to implement a selectable filtering function from multiple possible filtering functions. Such capability may be useful, for example, in multi-standard applications, where a filter in an integrated circuit may be required to support various operating modes and to switch between them dynamically. Examples of such modes include, but are not limited to, various specifications and/or settings of the same or different algorithms. In one example, a filter according to the present disclosure is configured to dynamically adjust between the following modes associated with two standards, long-term evolution (LTE) and/or wideband code division multiple access (WCDMA): LTE5M*2+WCDMA*2, LTE10M+LTE15M*2, LTE15M+WCDMA, LTE10M+LTE10M, and/or LTE20M (where *2 denotes two instances of the filter function and + denotes AND).

Systems according to the present disclosure may adhere to user-defined or customized configurations and/or functionalities, or to standards such as those governed by the standardization body 3 GPP (3rd Generation Partnership Project), e.g., LTE (long Term Evolution), LTE Advanced, GSM (Global System for Mobile Communications), GPRS (General Packet Radio Service), EDGE (Enhanced Data rates for GSM Evolution), or UMTS (Universal Mobile Telecommunications System), to name a few. Systems according to the present disclosure may be implemented using radio access technologies such as TDMA (Time Division Multiple Access), WCDMA (Wideband Code Division Multiple Access), TDD (Time Division Duplex), FDD (Frequency Division Duplex), OFDM (Orthogonal Frequency Division Multiplexing), WCDMA/TD-SCDMA (WCDMA Synchronous CDMA and Time Division WCDMA Synchronous CDMA), to name a few.

Combining multiple DSP blocks at runtime to perform larger filter functions may pose a number of challenges. A first challenge pertains to dynamically enabling or disabling chaining of outputs (or cascading) depending, for example, on the particular filtering function(s) being implemented. A second challenge pertains to dynamically changing symmetry settings, e.g., configuring the same DSP blocks to dynamically switch between a non-symmetric, an even-symmetric, and/or an odd-symmetric filtering function. Non-symmetric filters can be implemented by cascading shorter non-symmetric filters. It is typically more challenging to form symmetric filters. Systems and methods described herein accomplish this goal by breaking down a symmetric filter into one odd symmetric filter and one or more even symmetric filters.

Embodiments of the present disclosure provide cascadable DSP blocks for runtime programmable filter structures. This may be done by adding one more dynamic switch elements into the cascade chain of DSP blocks, and/or by adding one or more symmetry elements to the cascade chain for allowing each DSP block to be configured for even, odd, or no symmetry. Examples of such switch and symmetry elements will be discussed below.

FIG. 1 is a simplified schematic block diagram of an illustrative N-tap filtering architecture 100, according to some embodiments. For the purposes of illustration, the shown filtering architecture has N=8 multipliers, however, it is appreciated that the same concepts disclosed herein extend to other lengths and types of filters, without departing from the scope of this disclosure.

As shown, input signal samples are provided from input 102 through filtering chain 58 and combined using combination chain 62 with filter coefficient values as provided by coefficient circuitry bank 60. Corresponding filtered data is provided via output 104.

The filtering chain 58 has three portions: an upper portion 52, a middle portion 54, and a lower portion 56. As shown, the upper portion 52 includes N−1=7 controlled delay blocks $u_i$ (i=1, . . . , N), each block configured to selectively apply a respective first delay. These first delays may be fixed or adjustable, and may be implemented in any suitable manner. In one illustrative implementation involving a simple, single-channel, single-rate filter where the sample rate equals the clock rate, each delay block $u_i$ may correspond to one register stage. More complex filters that involve deeper delays may be built out of multiple register stages or memory blocks per delay block $u_i$.

The middle portion 54 includes one controlled delay block m for providing a first delayed output to the lower sample chain portion 56 and a second delayed output to the combination chain 62. The lower portion 56 has N−1=7 controlled delay blocks $l_i$ (i=1, . . . , N), each block configured to implement a selectable delay. Delay blocks $l_i$ may be implemented similarly to or differently from delay block $u_i$.

The combination chain 62 includes a cascade of N=8 combination circuitries, labeled $comb_i$ (i=1, . . . , N), for combining data samples with filter coefficient values to generate filtered data according to the N-tap filter. In the illustration of FIG. 1, each combination circuitry has four inputs. The two leftmost inputs of each combination circuitry are received from the filtering chain 58. The third input of each combination circuitry is received from coefficient circuitry bank 60. The fourth input is received from a previous combination circuitry (if the combination circuitry is cascaded to a previous combination circuitry) or set to zero if no such previous combination circuitry is cascaded, e.g., if the combination circuitry is the first one in the cascade.

In the illustrative example of FIG. 1, the first combination circuitry "$comb_1$" receives (1) as a first input, data output from the middle delay block m; (2) as a second input, data output from the last upper delay block $u_7$, (3) as a third input, coefficient values from coefficient circuitry $c_1$, and (4) as a fourth input, one or more null values from circuitry 110.

Each of the second through seventh combination circuitry, labeled $comb_i$ (i=2, ..., N−1), receives (1) as a first input, data output from lower delay block $l_{i-1}$, (2) as a second input, data output from upper delay block $u_{N-i}$, (3) as a third input, coefficient values from coefficient circuitry $c_i$, and (4) as a fourth input, data output by the previous combination circuitry $comb_{i-1}$.

The $N^{th}$ (in this example, $8^{th}$) combination circuitry, labeled $comb_8$, receives (1) as a first input, data from lower delay block $l_{i-1}$, (2) as a second input, input data from input 102, (3) as a third input, coefficient data from coefficient circuitry $c_8$, and (4) as a fourth input, data as output by the previous combination circuitry $comb_7$. The combination circuitry $comb_8$ outputs the filtered data to filtered output 104.

Coefficient circuitry bank 60 may include any suitable circuitry for generating filtering coefficients. For example, each coefficient circuitry $c_i$ (i=1, ..., 8) and/or circuitry 110 may include a coefficient register or other memory/storage circuitry for storing and/or providing filtering coefficient values (and/or null values), as appropriate. Combination circuitry may include any number of adders, multipliers, systolic adders, systolic chain registers, or any suitable circuitry.

Architecture 100 optionally includes testing blocks 106 and 108, for testing values at multiple points of the architecture. These points may be linked to the testing blocks 106 and 108 by vertical and horizontal lines (not shown) to ensure that the proper delays are being applied at the input and output of each element in the architecture.

It should be understood that architecture 100 is merely illustrative and other architectures may be used without departing from the scope of this disclosure. For example, one variation of the filter standard filter structure, referred to as "systolic structure", adds delay stages between the combination circuitries $comb_i$ of FIG. 1, using, for example, register delays. Such adding of register delays allows pipelining of the combination (e.g., adder) chain, such as combination chain 62 of FIG. 1. The pipelining may also involve delay matching. In the sample delay line or chain that matches the direction of the combination/adder chain, e.g., lower portion 56 of FIG. 1, an equal amount of register delays (equal to that in the combination chain) may be added. In the sample delay line or chain going in the opposite direction, e.g., as shown in upper portion 52 of FIG. 1, the same number of register delays may be deducted. Thus, in this implementation, adding one delay register per stage in the combination/adder chain may map into no register delays in one of the sample chains, and two register delays in the other sample chain.

In some embodiments, the upper portion of the filtering chain may implement a zero delay value, or "Delay 0" by, for example, implementing the delay blocks as wires. The lower portion of the sample filtering chain may implement a double delay value, or "Delay 2" by, for example, using double registers. The middle sample portion (or unit) may implement a single delay value, or "Delay 1." An exemplary implementation of the middle sample portion is shown by switch circuitry 150 of FIG. 2B, which includes selection circuitry 162 and single delay element 156. In the example of FIG. 1, the middle sample unit, shown as middle chain portion 54 of FIG. 1, provides two outputs: (1) a first output to be further delayed by the lower chain portion 56, and (2) a second output to be processed by combination chain 62 of FIG. 1. In some implementations, the middle sample unit can be controlled by symmetry and cascade control inputs (shown as control signal 160 in FIG. 2B) which specify (1) one of three filter symmetry settings: no symmetry, even symmetry, and odd symmetry and (2) whether cascading is on or off. Based on the value of this control input, the middle sample unit provides the first output to the lower chain (labeled "to_reverse" in Table 1 below) or the second output to the DSP combination circuitry (labeled "to_dsp" in Table 1 below). The lower chain may also be called reverse sample chain because it is directed opposite to the DSP combination circuitry chain.

TABLE 1

Delay selected by middle sample unit for each of outputs "to_reverse" and "to_dsp", as a function of symmetry control setting.

| | Input | | |
|---|---|---|---|
| Output | No symmetry | Even Symmetry | Odd Symmetry |
| To_reverse | 0 | Delay 1 | Delay 0 |
| To_dsp | 0 | Delay 1 | 0 |

FIG. 2A is a simplified schematic block diagram of illustrative DSP unit 10, according to some embodiments. DSP unit 10 has four data inputs, illustrated on the left as: Data In (Din), Cascade In (Cin), Sample Cascade In (SCin), and Add Cascade In (ACin). In one implementation, the SCin is the sample chain cascade input, shown as the connection between delay blocks $u_i$ (i=1, ..., N) of lower portion 56 in FIG. 1. In one implementation, ACin is the adder cascade input, which is shown as the connection between the combination circuitries $comb_i$ (i=1, ..., N) of combination/adder chain 56 in FIG. 1.

DSP unit 10 has two control inputs, illustrated on the bottom as symmetry control input (Sym) and cascade control input (Cas). The Sym control input may control the DSP unit to implement a filter with no symmetry, even symmetry, or odd symmetry. The Cas control input may specify to the DSP unit whether or not to expect an input from another cascaded DSP unit.

DSP unit 10 has three outputs: Data out (Dout), Sample Cascade out (SCout), and Add Cascade out (ACout). Each DSP unit may have its output port ACout provide a partial addition result to the next tap or DSP unit, and its output port Dout provide a data output that is useful for an external circuitry where the final filter results are will be used. In some implementations, Dout and ACout may correspond to two different ports outputting the same signal. In some implementations, Dout and ACout may be implemented as the same port. In other implementations, Dout and ACout may correspond to two different ports outputting different signals.

For example, in one implementation, ACout and Dout output the same signal, but route that signal to two different destinations: ACout is connected to a next DSP unit, e.g., to the ACin input port of that next DSP unit. Dout is connected to other circuitry for carrying, processing and/or consuming the final filter result, e.g., a circuitry external to the DSP units, such as a logic fabric portion where the final filter results will be used. Dout may effectively output the same signal as ACout, but if the external circuitry is interested only in the final (non-partial) filter results, as is typically the case, only the output of the last chained DSP unit would be used as Dout.

In one example, for an N-tap filter implemented using N chained DSP units having N ACout signals, N−1 of the N ACout signals feed into the next DSP block, and the $N^{th}$ ACout signal carries the filter output result. Typically, for each of the first N−1 DSP units of this N-tap filter, the Dout port to the consumer circuitry/logic fabric is left unconnected (as the intermediate adder results are not used outside of the DSP unit); the Dout port from the last, $N^{th}$ DSP block is connected to the logic fabric or other circuitry where the final filter results are will be used.

FIG. 2B shows one implementation 20 of the DSP unit 10 of FIG. 2A, in accordance with some embodiments. Particularly, DSP unit implementation 20 includes three dynamic switch circuitries 150, 170, and 190.

The first switch circuitry 150 includes selection circuitry 162 for providing, as output 169, one of two values: input data (Din) 152 and a zero or null value 154. This first switch circuitry 150 supports the symmetry functionality of DSP unit 10, and may be implemented as described by Table 1 above, e.g., to delay the input data samples or provide null values based on the symmetry settings specified by control input 160.

The second switch circuitry 170 includes selection circuitry 178 for outputting, as output 179, one of the input data 152, a sample cascaded input 172 that may be provided from another DSP unit in the chain, a null or zero value 174, and a delayed version 158 of the input data as output by single-delay element 156. This second switch circuitry 170 supports the symmetry and cascading functionality of DSP unit 10, based on control input 176. For example, control input 176 may specify whether or not the cascading and/or symmetry functionality of the DSP unit 10 is enabled.

The third switch circuitry 190 includes selection circuitry 196 for outputting one of add cascade input (ACin) 192, and a null/zero value 194. This third switch circuitry 190 supports the cascading functionality of DSP unit 10 based on cascade control input 198. For example, if cascade control input 198 specifies that cascading is to be supported by DSP unit 10 (e.g., that DSP unit 10 will receive the output of another DSP unit), then the Add Cascade input is passed on as output 199 of switch circuitry 190. Otherwise, if cascade control input 198 specifies that no cascading is to be supported by DSP unit 10, then a zero value is passed on as output 199 of switch circuitry 190.

To generate outputs of DSP unit 10, outputs of the first, second, and third selection circuitries are processed and/or combined using combination circuitry including delay blocks 182 and 200, adder circuitry 186 and 202, and multiplier circuitry 168. In the example shown in FIG. 2B, the output 179 of the second switch circuitry 170 is provided to pre-adder circuitry 186 for combining with output 169 of the first switch circuitry 150. This output 179 may be delayed by double-delay element 182 and provided as sample cascade output 184 to a subsequent DSP unit, if applicable. Multiplier circuitry 168 combines the output of pre-adder circuitry 186 with coefficient values 166. (These coefficient values are input via Cin.) The product supplied by multiplier circuitry 168 is summed with the output 199 of the third switch circuitry, and is further delayed by single-delay element 200. The delayed output of adder 202 is provided as both Add Cascade Out (ACout) and Data out (Dout) of DSP unit 10.

In one implementation, the cascade input SCin communicates, to the DSP unit, information about another DSP unit in the chain. For example, the cascade input SCin may tell the DSP unit whether the last (e.g., rightmost) DSP unit is in middle tap mode or in standard FIR cascade mode. For example, in middle tap mode, the rightmost DSP block is a middle tap, meaning that it does not take inputs from adjacent DSP blocks. In some embodiments, configuring a DSP block in "middle tap mode" disables the sample-cascade and the result-cascade inputs. In contrast, in standard FIR cascade mode, the rightmost DSP unit may take inputs from adjacent DSP units and its sample-cascade and the result-cascade inputs may be enabled. The following tables explain an exemplary operation of pre-adder 186 as a function of symmetry input Sym and cascade mode input Cas of DSP unit 10.

The components of DSP unit 10 may be configured to provide inputs to the pre-adder circuitry 186, as follows:

TABLE 2

Illustrative combination operation based on symmetry and cascade inputs of DSP unit 10.

| Symmetry "Sym" | Cascade "Cas" | Pre-adder Operation |
| --- | --- | --- |
| Odd | Off | Din (+0) |
| Even | Off | Din + Din_delayed |
| No Symmetry | Off | Din (+0) |
| Odd | On | Din + SCin |
| Even | On | Din + SCin |
| No Symmetry | On | Din (+0) |

One way to effectuate the configuration above is to configure switches 150 and 170 as described below. First, switch 150 may be configured to output the following values, based on the symmetry and cascading parameters it receives, e.g., via control input 160:

TABLE 3

Illustrative output of switch 150 (cascade-in) based on symmetry and cascade inputs of DSP unit 10.

| Symmetry "Sym" | Cascade "Cas" | Output of switch 150 |
| --- | --- | --- |
| Odd | Off | 0 |
| Even | Off | Din |
| No Symmetry | Off | Din |
| Odd | On | Din |
| Even | On | Din |
| No Symmetry | On | Din |

Second, switch 170 may be configured to output the following values (corresponding to the reverse sample chain), based on the symmetry and cascading parameters it receives, e.g., via control input 176:

TABLE 4

Illustrative output of switch 170 (reverse chain) based on symmetry and cascade inputs of DSP unit 10.

| Symmetry "Sym" | Cascade "Cas" | Output of switch 170 |
|---|---|---|
| Odd | Off | Din |
| Even | Off | Din_delayed |
| No Symmetry | Off | 0 |
| Odd | On | SCin |
| Even | On | SCin |
| No Symmetry | On | 0 |

Implementation 20 of DSP unit 10 is only exemplary, and modifications may be made without departing from the scope of the disclosure. For example, delay blocks 182 and 200 may be moved closer to the input side of the DSP unit, so that they are, for example, immediately after the output of switch 170 and 190, respectively, rather than on the output side of the DSP unit. Additionally or alternatively, the symmetry properties of combination circuitry such as preadder circuitry 186 may be exploited to rearrange various aspects of implementation 20, e.g., by swapping inputs 179 and 169 without modifying the addition output of pre-adder circuitry 186. In one alternative implementation, Din may be a direct input of pre-adder 186, and is then multiplexed into the reverse sample chain for the next DSP units. Similar or different modifications may be made by adding, removing, and/or rearranging various parts of implementation 20.

DSP unit 10 may be cascaded with other similar DSP units to perform filtering functions that can be dynamically changed at runtime. As merely an example, FIGS. 3, 4, 5, and 6 below illustrate how the same six DSP units (labeled 302, 304, 306, 308, 310, and 312) can be used to implement and/or dynamically switch between multiple different filtering functions with multiple characteristics such as symmetry, length, and ability to handle complex inputs.

Figure 7:
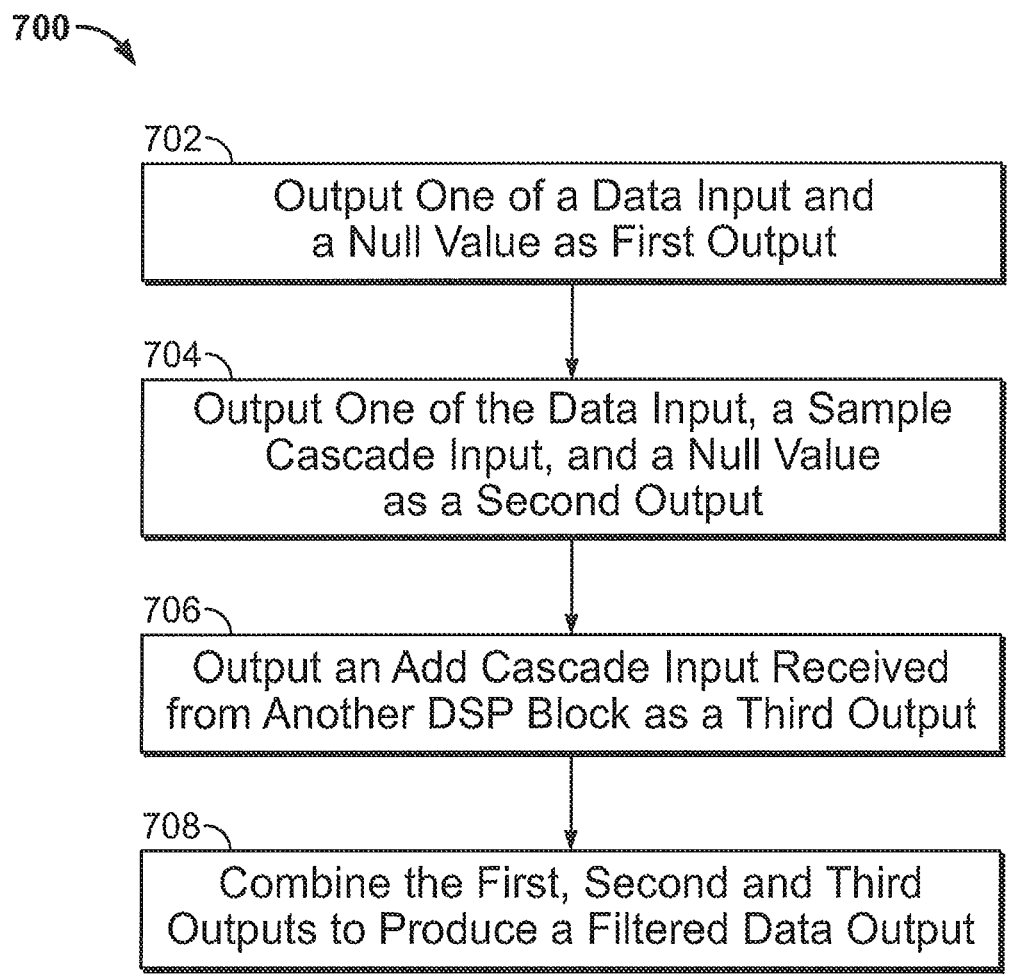
FIG. 7 is a flow diagram illustrating a process for processing signals in an integrated circuit, in accordance with some embodiments.

FIG. 7 is a flow diagram illustrating a process 700 for processing signals in an integrated circuit such as DSP unit or block 10, in accordance with some embodiments.

At 702, a first output is provided from one of a data input and a null value. This first output may be similar to output 169 of FIG. 2B. In some embodiments, this step involves outputting the first output from one of a data input, a null value, and a delayed version of the data input. The null value may correspond to zero or any other suitable value. This first outputting may be based on a symmetry setting value that could be set to one of an odd-symmetry setting value, an even-symmetry setting value, and/or a no-symmetry setting value. This first outputting may, alternatively or in addition, be based on a cascade enable value that could be set, for example, to on or off.

At 704, a second output is provided from one of the data input, a sample cascade input, and a null value. This second output may correspond to output 179 of FIG. 2B. In some embodiments, this step involves outputting the second output from one of the data input, a delayed version of the data input, the sample cascade input, and the null value. The null value may correspond to zero or any other suitable value. This second outputting may be based on the symmetry setting value and/or the cascade enable value, similar to the first outputting step.

At 706, a third output is provided based on an add cascade input, that may be received from another DSP block. This other DSP block may be cascaded to the instant DSP block. This third output may correspond to output 199 of FIG. 2B. In some embodiments, this step involves outputting the third output from one of the add cascade input (received from another DSP block) and a null value. The null value may correspond to zero or any other suitable value. This third outputting may be based on the symmetry setting value and/or the cascade enable value, similar to the first and third outputting step. In some embodiments, this third output is the add cascaded input ACin from another DSP block if cascading is enabled, and is a null value if cascading is disabled.

At 708, the first, second, and third outputs are combined to produce a filtered data output. The filtered data output may correspond to the Data Out signal (Dout) 204 and/or the Add Cascade Out (ACout) 206. This filtered data may be passed on to another DSP block, and/or may be output to an external circuitry as a final filtering result.

FIG. 3 illustrates one possible configuration 300 with the six DSP units to implement a five-tap symmetrical filter and a three-tap non-symmetrical filter. The five-tap symmetrical filter of configuration 300 is implemented using a cascade of one odd symmetrical filter (implemented as DSP unit 302) and two even symmetrical filters (implemented as DSP units 304 and 306). Specifically, input data samples are provided at Din inputs of DSP units 302, 304, and 306 and the corresponding filter output data samples are provided from the Dout output of DSP unit 306. The cascade control input (Cas) of the first DSP unit 302 is off because DSP unit 302 is the first one in the cascade and does not expect a cascaded input from another unit. The cascade control input of each of the second and third DSP units 304 and 306 is on to enable cascading from the respective previous DSP unit.

The three-tap non-symmetrical filter of configuration 300 is implemented using three non-symmetrical filters (implemented using cascaded DSP units 308, 310, and 312). Specifically, input data samples are provided at Din inputs of cascaded DSP units 308, 310, and 312 and the corresponding filter output data samples are provided from the Dout output of DSP unit 312. The cascade control inputs of the cascaded DSP units 308, 310, and 312 are set similarly to cascaded DSP units 302, 304, and 306, respectively. Unlike DSP units 302, 304, and 306, however, each of DSP units 308, 310, and 312 receives a non-symmetrical "Sym" control input.

FIG. 4 illustrates one possible configuration 400 with the six DSP units to implement an 11-tap symmetrical filter. The 11-tap symmetrical filter is implemented using a cascade of one odd symmetrical filter (implemented using DSP unit 302) followed by five even symmetrical filters (implemented as DSP units 304, 306, 308, 310, and 312). The cascading functionality of the filter is implemented by setting the cascade control input of the first DSP unit 302 to Off and each of the cascade control input of the remaining DSP units to On. The symmetry functionality of the filter is implemented by setting the symmetry control input of the first DSP unit 302 to Odd and that of the remaining DSP units to Even.

Figure 5:
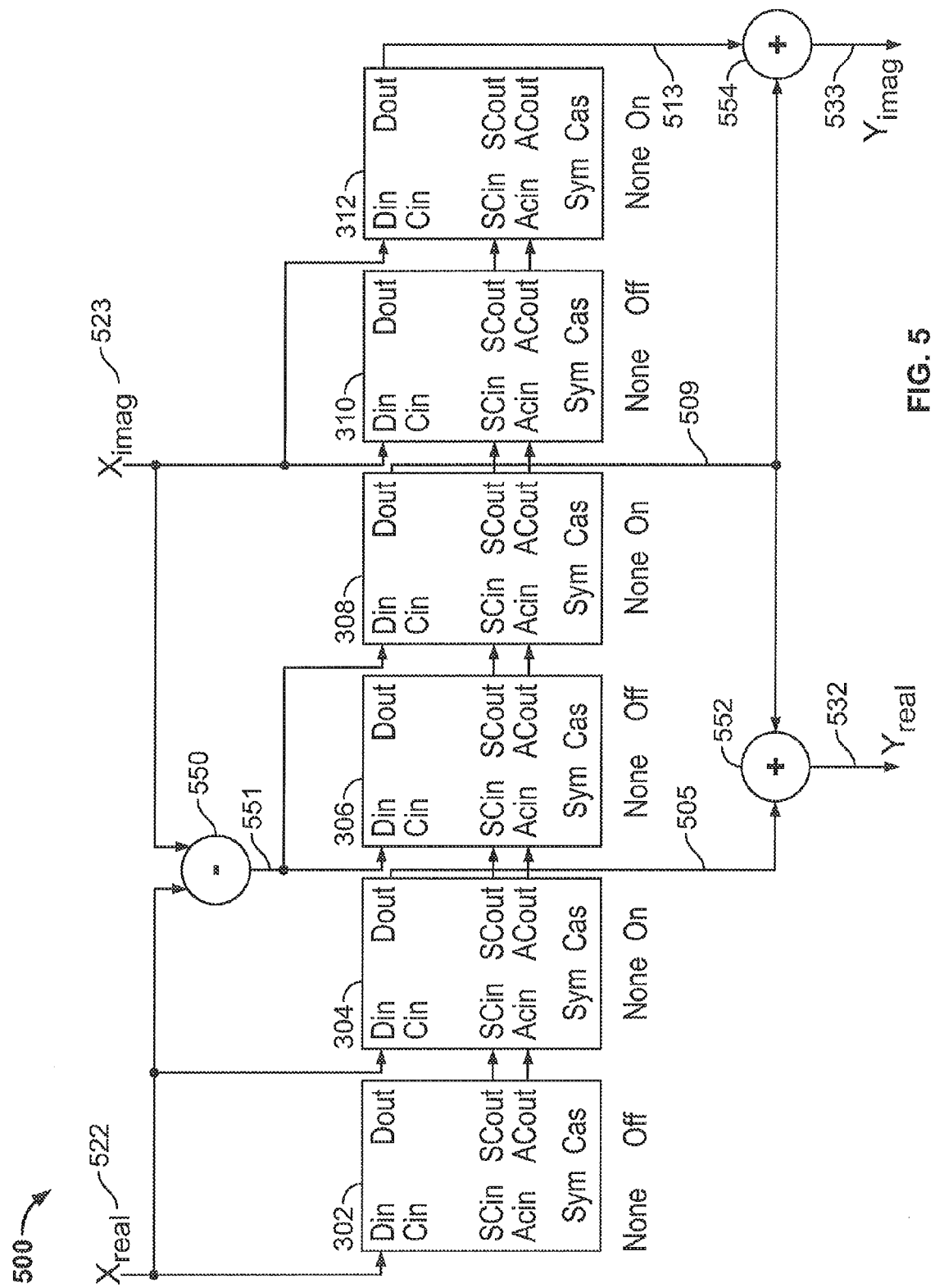
FIG. 5 illustrates one possible configuration to implement a complex 2-tap non-symmetrical filter, in accordance with some embodiments.

FIG. 5 illustrates one possible configuration 500 with the six DSP units to implement a complex 2-tap non-symmetrical filter. The complex 2-tap non-symmetrical filter is implemented using three cascades, each of two non-symmetrical filters. These three cascades are implemented using three pairs of DSP units: a first pair of DSP units 302 and 304, for processing the real components of the input data, a second pair of DSP units 306 and 308, for processing the real and imaginary components of the input data, and a third pair of DSP units 310 and 312, for processing the imaginary components of the input data. The cascading functionality of the complex 2-tap non-symmetrical filter is implemented by setting the cascade control input of the first DSP unit in each pair to Off and that of the second DSP unit to On. The symmetry functionality of the filter is implemented by setting the symmetry control inputs of all of the DSP units to None. The complex computation aspect of the filter is implemented using combination circuitry, including subtraction circuitry 550 and adder circuitries 552 and 554. Specifically, the first cascaded pair of DSP units 302 and 304 processes the real component 522 of the input data (labeled "$x_{real}$") and outputs real partial output 505. The third cascaded pair of DSP units 310 and 312 processes the imaginary component 523 of the input data (labeled "$x_{imag}$") and outputs imaginary partial output 513. The second cascaded pair of DSP units 306 and 308 processes the difference between $x_{real}$ and $x_{imag}$, as output by subtraction circuitry 550, to output mixed partial output 509. This mixed partial output 509 is combined with real partial output 505 using adder circuitry 532 to generate the real component 532 of the filtered, output data (labeled "$y_{real}$"). The mixed partial output 509 is combined with imaginary partial output 513 using adder circuitry 554 to generate the real component 533 of the filtered, output data (labeled "$y_{imag}$").

Figure 6:
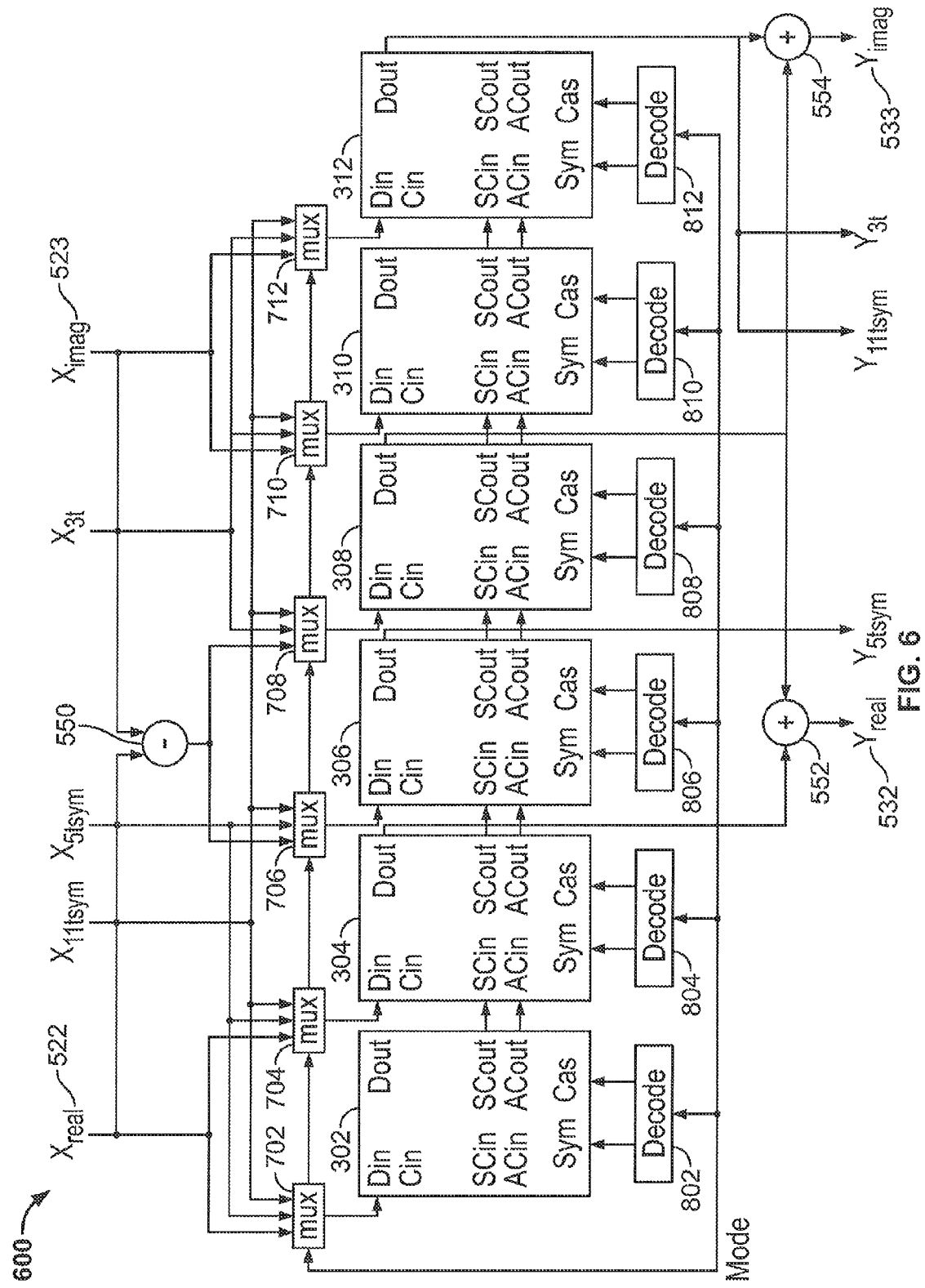
FIG. 6 illustrates one possible configuration to implement the three filter configurations from FIGS. 3, 4, and 5, in accordance with some embodiments.

FIG. 6 illustrates one possible configuration 600 with the six DSP units to implement all three filter configurations 300, 400, and 500 from FIGS. 3, 4, and 5, respectively. Specifically, configuration 600 configures the six DSP units 302, 304, 306, 308, 310, and 312 to implement three filtering functions: (a) a five-tap symmetrical filter (associated with input "$x_{5tsym}$" and output "$y_{5tsm}$") and a three-tap non-symmetrical filter (associated with input "$x_{3t}$" and output "$y_{3t}$"), (b) an 11-tap symmetrical filter (associated with input "$x_{11tsym}$" and output "$y_{11tsm}$"), and (c) a complex 2-tap non-symmetrical filter (associated with inputs "$x_{real}$" and "$x_{imag}$" and outputs "$y_{real}$" and "$y_{imag}$"). (The combination circuitries 550, 552, and 554 are described in FIG. 5 above.)

To dynamically switch between the three filtering functions described above, configuration 600 includes input selection (or "mux") circuitries 702, 704, 706, 708, 710, and 712, and decoder circuitries 802, 804, 806, 808, 810, and 812.

As shown, each of the input selection circuitries 702, 704, 706, 708, 710, and 712 is configured based on a an input control signal "mode" to select, dynamically, the input(s) corresponding to a target filtering function. The input control signal "mode" can be set based on user configuration using software and/or hardware. In the illustrative example of FIG. 6, each of the input selection circuitries may be configured based on the control signal "mode" to select, dynamically, either the input(s) corresponding to the first filtering function (a) (e.g., inputs $x_{5tsym}$ or $x_{3t}$), the input(s) corresponding to the second filtering function (b) (e.g., input $x_{11tsym}$), or the input(s) corresponding to the third filtering function (c) (e.g., $x_{real}$, $x_{imag}$, or their combination/difference). The control signal may be passed between the input selection circuitries, as shown, or it may be provided to each selection circuitry in any other suitable way, such as directly from the mode control input and/or via memory circuitry.

As shown, each of the decoder circuitries 802, 804, 806, 808, 810, and 812 decodes the control signal "mode" into the appropriate symmetry control input signal "Sym" and/or cascading control input signal "Cas" of each DSP unit 302, 304, 306, 308, 310, and 312, respectively. The decoder circuitries may be implemented as a word decoder (e.g., 3b decoder) or any other suitable circuitry for mapping from a selected filtering function (or mode) to the Sym and Cas settings for a corresponding DSP unit. An exemplary mapping implemented by the decoder circuitries from the mode control signal to the configuration of each DSP unit is shown in Table 2 below.

TABLE 2

Control signal settings for DSP units based on selected mode input.

| | mode | | | | | |
|---|---|---|---|---|---|---|
| | Filtering function (a) | | Filtering function (b) | | Filtering function (c) | |
| output | Sym | Cas | Sym | Cas | Sym | Cas |
| First DSP Unit | Odd | Off | Odd | Off | None | Off |
| Second DSP Unit | Even | On | Even | On | None | On |
| Third DSP Unit | Even | On | Even | On | None | Off |
| Fourth DSP Unit | None | Off | Even | On | None | On |
| Fifth DSP Unit | None | On | Even | On | None | Off |
| Sixth DSP Unit | None | On | Even | On | None | On |

Providing DSP circuitry on an IC (especially ICs like PLDs, FPGAs, and the like) in the form of a plurality of DSP units (e.g., meaning multiple instances of identical or substantially identical instances of DSP module circuitry) according to embodiments of the present disclosure can be advantageous and desirable for several reasons. For example, systems and methods described herein may reduce logic and memory resources (e.g., registers) around DSP units for multi-standard FIRs. This may result in logic and register savings, in related savings in power consumption, and in reduction in routing congestion around DSP units, thereby increasing performance.

Table 3 below illustrates exemplary savings for a case with six DSP units, with standard vs. cascade switch as described above.

TABLE 3

Exemplary savings for a 6-DSP unit architecture.

| | Without Cascade Switch | With Cascade Switch | Savings |
|---|---|---|---|
| Input multiplexers | 6 * 18 | 6 * 18 | 0 |
| Input shift chain | 6 * 18 | 0 | 6 * 18 |
| Output reregistering | 6 * 40 | 4 * 40 | 2 * 40 |
| DSP units | 6 | 6 | 0 |
| Output adder chain | 5 * 40 | 0 | 5 * 40 |
| Adder chain registers | 5 * 40 | 0 | 5 * 40 |
| Complex adders | 1 * 18 + 2 * 40 | 1 * 18 + 2 * 40 | 0 |
| Overall registers | 546 | 240 | 306 |
| Overall adders/multiplexers | 406 | 206 | 200 |

The savings illustrated above may increase with the number of taps/multipliers in the filter. In one example, additional savings may be achieved where the same numbers of inputs, outputs, or DSP units are used to implement longer filters. In a second example, additional savings may be achieved where savings in cascade adders scale with the number of multipliers. As to performance, benefits may be achieved because more logic can be pushed inside the DSP unit without reducing speed (e.g., more logic may be pushed inside the DSP unit while guaranteeing the same maximum clock frequency on the IC). As a result, there may be less routing congestion on the input and output side of the DSP unit. As to power, although filter chains inside the DSP block may consume power regardless of whether they are used or not, reduced soft logic may translate into power savings.

Other advantages may include design efficiency, e.g., because only as many DSP blocks as are needed may be put together, and any other DSP blocks on the IC remain available for other purposes. Still another advantage of DSP blocks is that they may include circuitry that is dedicated to performing DSP operations (rather than being more completely general-purpose circuitry). Such DSP block circuitry can therefore perform DSP operations more efficiently. Yet other advantages may include adding flexibility to allow users to switch dynamically between different filter structures while maintaining the advantages of a hard macro (such as pre-placed pre-routed design blocks created for a specific FPGA family). The advantages include reduced silicon area and power consumption when compared to soft macro implementations.

Other advantages may include reducing latency and the ability to map into and/or leverage pre-existing filtering architectures. For example, systems and methods described above can be implemented by modifying existing filtering architectures using no or few additional, external resources. In one instance, systems and methods described above can build on the same number of adders and/or multipliers of previous DSP blocks.

It will be understood that the foregoing is only illustrative of the principles of this disclosure, and that various modifications can be implemented by those skilled in the art without departing from the scope and spirit of the invention. For example, the numbers of various elements such as multiplexers, taps, adders, and multiplexers as well as mappings and savings described in the tables above, have been provided as only examples, and larger or smaller values can instead be used without departing from the disclosure. For example, Table 3 is only illustrative of one example in which systems and methods described herein result in savings in logic/memory resources. Accordingly, Table 3 is meant merely for the purpose of illustration not limitation and embodiments according to this disclosure may achieve savings that are similar, higher, or lower than what is described herein, without departing from the scope of this disclosure.

In some embodiments, interfaces and register maps as described in architectures above may be configured manually and/or created automatically using software. For example, some parts of the structure of FIG. 1 may be generated automatically using software, while other parts may be generated by the user, e.g., by manually adding new ports for cascading samples and partial results.

It will be understood that the above steps of process 700 of FIG. 7 may be executed or performed in any order or sequence not limited to the order and sequence shown and described in the figure. Also, some of the above steps of this process may be executed or performed substantially simultaneously where appropriate or in parallel, e.g., to reduce latency and processing times.

It will also be understood that all structure shown herein is typically electrical circuitry that may be implemented using software and/or hardware, and that all functions described herein (e.g., multiplication, addition, multiplexing, etc.) are performed by such circuitry operating on electrical signals indicative of digital data words. Such digital data words may be referred to as input data signal samples, multiplicands, multipliers, products, sums, etc., but they are all typically embodied as electrical signals. Terms like "leftmost," "first," "second," "third," etc., may sometimes be used herein solely as arbitrary identifiers for different occurrences of somewhat similar elements. In such contexts, use of these arbitrary identifiers does not imply any particular order of the elements referred to. Nor does use of a term like "first" by itself necessarily imply that a "second" such element is also present. Similarly, use of a term like "second" does not by itself necessarily imply that a "first" such element is also present.

The invention claimed is:

1. Digital signal processing block circuitry in a configurable filter, comprising:
   a first multiplexer that provides a first output as a first function of symmetry type used in the filter and of whether cascading is used in the filter;
   a second multiplexer that receives a plurality of inputs that provides a second output as a selection of one of the plurality of inputs as a second function of symmetry type of the filter and whether cascading is used in the filter; and
   combination circuitry that combines the first output and the second output to produce a filtered data output by:
   adding the first output and the second output to produce a first sum; and scaling the first sum with a filter coefficient input.

2. The digital signal processing block circuitry of claim 1, comprising a third multiplexer that that provides an add cascade input received from another digital signal processing block circuitry as an add cascade output when cascading is used in the filter.

3. The digital signal processing block circuitry of claim 2, wherein the third multiplexer provides a null output as the add cascade output when cascading is not used in the filter.

4. The digital signal processing block circuitry of claim 3, wherein the combination circuitry adds the add cascade output to the scaled first sum to form the filtered data output.

5. The digital signal processing block circuitry of claim 1, wherein the first multiplexer provides the first output as a null value when the symmetry type of the filter is odd symmetry and cascading is not used in the filter.

6. The digital signal processing block circuitry of claim 5, wherein the first multiplexer provides the first output as a data input to the digital signal processing block when the symmetry type of the filter is not odd or cascading is included in the filter.

7. The digital signal processing block circuitry of claim 1, wherein the digital signal processing block circuitry receives a configuration signal that configures the filter, wherein the configuration signal comprises an indication of the symmetry type and an indication of whether cascading is used in the filter.

8. The digital signal processing block circuitry of claim 7, wherein the symmetry type comprises an odd-symmetry setting value indicating an odd symmetry for the filter, an even-symmetry setting value indicating an even symmetry for the filter, and a no-symmetry setting value indicating no symmetry for the filter.

9. The digital signal processing block circuitry of claim 1, wherein the combination circuitry comprises a delay block that delays the filtered data output before outputting the filtered data output.

10. The digital signal processing block circuitry of claim 9, wherein the symmetry type comprises an odd-symmetry setting value indicating an odd symmetry for the filter, an even-symmetry setting value indicating an even symmetry for the filter, and a no-symmetry setting value indicating no symmetry for the filter.

11. A method of configuring a programmable integrated circuit as digital signal processing block circuitry as a configurable filter, the method comprising:
configuring logic of the programmable integrated circuit as a first multiplexer that provides a first output as:
a null value when one or more control signals indicates that a first symmetry type and cascading is used in the filter; and
a data input when the control signals indicate that the first symmetry type and cascading is not used in the filter;
configuring logic of the programmable integrated circuit as second multiplexer that receives a plurality of inputs and provides a second output as a selection of one of the plurality of inputs based at least in part on the control signals; and
configuring logic of the programmable integrated circuit as combination circuitry that combines the first output and the second output to form a filtered output by:
adding the first output and the second output to produce a first sum; and
scaling the first sum with a filter coefficient input to produce a multiplication output.

12. The method of claim 11, comprising configuring logic of the programmable integrated circuit as a third multiplexer that provides a third output as:
an add cascade input received from another digital signal processing block circuitry as third output when cascading is used in the filter; and
a null output as the third output when cascading is not used in the filter.

13. The method of claim 12, configuring logic of the programmable integrated circuit as the combination circuitry that adds the third output and the scaled first sum to produce the filtered output.

14. The method of claim 11, comprising receiving the control signals, at the digital signal processing block circuitry, comprising a symmetry setting value indicating a symmetry type for the filter and a cascade enable value indicating whether cascading is used in the filter.

15. The method of claim 11, wherein the digital signal processing block circuitry dynamically switches between a first filter structure and second filter structure based on the control signals indicating a filter type for the filter.

16. A method of processing a signal using a filter spanning one or more digital signal processing block circuitries, the method comprising:
outputting, using a first multiplexer, a first output as a first function of one or more control signals, wherein the one or more control signals indicate which symmetry type is used in the filter and whether cascading is used in the filter
outputting, using a second multiplexer, a second output as a selection of a plurality of inputs to the second multiplexer using a second function of the control signals;
outputting, using a third multiplexer, a third output that includes an add cascade input received from another digital signal processing block circuitry of the one or more digital signal processing block circuitries when the control signals indicate that cascading is used in the filter; and
combining the first output, the second output, and the third output to produce a filtered data output, wherein combining comprises:
adding the first output and the second output to produce a first sum;
multiplying the first sum with a filter coefficient input to produce a multiplication output; and
adding the third output and the multiplication output to produce a second sum.

17. The method of claim 16, wherein outputting the first output comprises outputting a null value when the control signals indicate that the filter has an odd symmetry type and that cascading is not used in the filter.

18. The method of claim 16, wherein outputting the first output comprises outputting a data input when the control signals indicate the filter does not have an odd symmetry type or that cascading is used in the filter.

19. The method of claim 16, wherein outputting the first output comprises outputting:
a null value when the control signals indicate that the filter has no symmetry;
a data input when the control signals indicate that the filter has an odd symmetry and cascading is not used in the filter;
a delayed data input when the control signals indicate that the filter has an even symmetry and cascading is not used in the filter; and
a received sample cascade input when the control signals indicate that the filter has symmetry and cascading is used in the filter.

20. The method of claim 16, comprising dynamically configuring the filter in the one or more digital signal processing block circuitries between a first filter structure and a second filter structure using the control signals.

* * * * *